(12) United States Patent
Zehavi

(10) Patent No.: US 6,617,540 B2
(45) Date of Patent: *Sep. 9, 2003

(54) WAFER SUPPORT FIXTURE COMPOSED OF SILICON

(75) Inventor: Raanan Zehavi, Sunnyvale, CA (US)

(73) Assignee: Integrated Materials, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/792,674

(22) Filed: Feb. 23, 2001

(65) Prior Publication Data

US 2001/0008232 A1 Jul. 19, 2001

Related U.S. Application Data

(62) Division of application No. 09/292,491, filed on Apr. 15, 1999, now Pat. No. 6,225,594.

(51) Int. Cl.[7] .......................... B23K 26/20; H01L 21/30
(52) U.S. Cl. .............................. 219/121.64; 211/41.18
(58) Field of Search .................. 219/121.63, 121.64; 118/724, 728, 500; 206/454, 710, 711, 832, 833, 524.6; 211/41.18

(56) References Cited

U.S. PATENT DOCUMENTS

| | | | |
|---|---|---|---|
| 3,247,576 A | 4/1966 | Dill, Jr. et al. ............. 29/155.5 |
| 3,901,423 A | 8/1975 | Hillberry et al. ................ 225/2 |
| 4,177,789 A | 12/1979 | Marocco .......................... 125/1 |
| 4,318,749 A | 3/1982 | Mayer ........................ 134/25.4 |
| 4,566,839 A | 1/1986 | Butler .......................... 414/404 |
| 4,872,554 A | 10/1989 | Quernemoen ................ 206/454 |
| 4,911,002 A | 3/1990 | Enderlin et al. ................ 73/153 |
| 4,914,269 A | 4/1990 | Kinsman et al. ......... 219/121.64 |
| 4,955,357 A | 9/1990 | Takeguchi et al. ........ 125/23.01 |
| 4,966,549 A | 10/1990 | Ohdate ........................ 432/253 |
| 5,020,476 A | 6/1991 | Bay et al. ..................... 118/728 |
| 5,468,297 A | 11/1995 | Letort .......................... 118/728 |
| 5,492,229 A | 2/1996 | Tanaka et al. ................. 211/41 |
| 5,534,074 A | 7/1996 | Koons .......................... 118/728 |
| 5,586,880 A | 12/1996 | Ohsawa ....................... 432/241 |
| 5,595,604 A | 1/1997 | Kobayashi et al. .......... 118/715 |
| 5,658,103 A | 8/1997 | Inokuchi et al. ............. 408/145 |
| 5,752,609 A | 5/1998 | Kato et al. ................ 211/41.18 |
| 5,779,797 A | 7/1998 | Kitano .......................... 118/500 |
| 5,820,683 A | 10/1998 | Ishii et al. .................... 118/728 |
| D404,371 S | 1/1999 | Shimazu ..................... D13/182 |
| 5,858,103 A | 1/1999 | Nakajima et al. ............ 118/728 |
| 5,863,334 A | 1/1999 | Chou et al. .................. 118/500 |

(List continued on next page.)

FOREIGN PATENT DOCUMENTS

| | | |
|---|---|---|
| EP | 0 506 052 A1 | 9/1992 |
| EP | 0 793 260 A1 | 9/1997 |
| JP | 63-313684 | 12/1988 |
| JP | 2-151385 A * | 6/1990 |
| RU | 1630907 A1 | 2/1991 |
| WO | WO 00/2119 | 4/2000 |

OTHER PUBLICATIONS

"Information about Silicon Furnace Tubes," Dow Corning, no date, 4 pp.

Polyboat: Series 7700, Semiconductor Specialties Corp., no date, pp. 1–24.

1979 Catalog Supplement, Semiconductor Specialties Corp., no date, 4 pp.

*Primary Examiner*—Geoffrey S. Evans
(74) *Attorney, Agent, or Firm*—Charles S. Guenzer

(57) ABSTRACT

A silicon wafer process fixture having various silicon members secured together. The fixture may include a plurality of generally elongate silicon support member secured to a generally planar silicon base. The silicon members may be made of monocrystalline silicon, polycrystalline silicon, or virgin polysilicon.

15 Claims, 2 Drawing Sheets

U.S. PATENT DOCUMENTS

| | | |
|---|---|---|
| D411,176 S | 6/1999 | Shimazu .................... D13/182 |
| 5,915,370 A | 6/1999 | Casper .................... 125/13.01 |
| 5,921,773 A | 7/1999 | Lee ........................... 432/258 |
| 5,931,666 A | 8/1999 | Hengst ...................... 432/258 |
| 6,056,123 A * | 5/2000 | Niemirowski et al. ...... 206/711 |
| 6,065,615 A | 5/2000 | Uchiyama et al. ....... 211/41.18 |
| 6,225,594 B1 * | 5/2001 | Zehavi .................. 219/121.64 |
| 6,284,997 B1 * | 9/2001 | Zehavi et al. |
| 6,455,395 B1 * | 9/2002 | Boyle et al. |

* cited by examiner

WAFER SUPPORT FIXTURE COMPOSED OF SILICON

RELATED APPLICATIONS

This application is a division of Ser. No. 09/292,491, filed Apr. 15, 1999, now issued as U.S. Pat. No. 6,225,594. It is also related to Ser. No. 09/292,495 and Ser. No. 09/292,496, both filed Apr. 15, 1999 and now issued as U.S. Pat. Nos. 6,196,211 and 6,205,993 respectively.

BACKGROUND OF THE INVENTION

1. Field of the Invention

The present invention relates generally to wafer processing fixtures. Specifically, the present invention relates to silicon support fixtures having multiple silicon members secured together.

2. Technical Background

In the fabrication of semiconductor wafers it is often necessary to hold the wafers in precise positions during various processing steps. Relatively large and complex structures such as "boats" or "towers" are typically employed to that end. One example of such a structure is described in U.S. Pat. No. 5,492,229 to Tanaka et al. The Tanaka et al. patent is directed to a vertical boat for holding a plurality of semiconductor wafers. The boat includes two end members and a plurality of support members. In one embodiment, the support members are formed from pipe members cut vertically to provide a long plate member having a cross section of a quarter-circular arc. In another embodiment, the support members are formed from pipe members cut vertically to provide a long plate member having a cross section of a semicircular arc. The Tanaka et al. patent lists as potential materials for its boats the following: silica glass, silicon carbide, carbon, monocrystal silicon, polycrystal silicon, and silicon carbide impregnated with silicon. The various components are to be welded together if made from silica glass; otherwise, "they may be assembled in a predetermined manner".

U.S. Pat. No. 5,534,074 to Koons is directed to a vertical boat for holding semiconductor wafers. The boat includes a plurality of rods having slots cut along their lengths. The configuration of the slots is intended to reduce shadowing on wafers placed within the boat during processing. The rods are cylindrical, and are specified as being made from fused quartz, although "any known material suitable for holding wafers may be used."

U.S. Pat. No. 4,872,554 to Quernemoen shows a reinforced carrier for silicon wafers and the like. The carrier includes side components consisting of tubular rails with wafer spacing and supporting teeth projecting therefrom. The rails are made from plastic, and may be provided with rigid inserts for stiffening purposes. The teeth can be integrally molded with, or fused to, the rails.

U.S. Pat. No. 5,752,609 to Kato et al. is directed to a wafer boat including a plurality of rods arranged to support ring members. A plurality of wafer supporting pieces are associated with the ring members, and include angular projections for contacting the wafers. The Kato et al. patent also illustrates a wafer boat having a plurality of cylindrical quartz rods having wafer support recesses formed therein.

The theoretical advantages provided by pure silicon structures are well known. Conventional towers and boats are typically made from quartz or silicon carbide, which introduce contamination and become unstable at higher temperatures. By fabricating wafer holding structures from the same materials as the wafers themselves, the possibility of contamination and deformation is minimized. The structure would react to processing temperatures, conditions, and chemistry in exactly the same way that the wafers would, thus greatly enhancing the overall effective useful life of the structure.

Unfortunately, standard assembly of silicon structures in a "predetermined manner" as set forth in Tanaka et al. is one of the reasons that pure silicon has not gained wide acceptance as a material for structures such as boats and towers. The difficulties of working with monocrystalline silicon, polycrystalline silicon, and virgin polycrystalline have led to the development of structures such as that shown in Tanaka et al., wherein, when considering monocrystalline silicon as the material of choice, the connections between the support members and the end members are not described at all, and the only specifically described method of fabricating support structures involves cutting extruded tubular members. Such support structures are inherently less stable than those made from more traditional and easily-worked materials such as quartz or silicon carbide.

Similarly, the patents to Koons, Quernemoen, and Kato et al. fail to address the specific problems of providing a strong, reliable wafer support structure that reduces shadowing and contamination. The projections and slots described in these patents, while effective to some extent, are either not suited for fabrication from materials such as silicon, or require a relatively large cross-sectional area to provide stable and precise wafer support.

Silicon is perceived as being extremely fragile and difficult to fuse. Due to these perceptions, known silicon structures are widely believed to be delicate at best, and unreliably flimsy at worst. Consequently, they have failed to receive broad commercial acceptance.

It can thus be seen that the need exists for a strong, reliable support member for wafer processing fixtures that will reduce shadowing and contamination while providing stable and precise wafer support.

SUMMARY OF THE INVENTION

A method of securing a first silicon member to a second silicon member to form at least a part of a silicon wafer processing fixture is disclosed, as is the silicon wafer processing fixture itself. The method includes the step of providing a first silicon member with an outwardly-extending attachment element. A second silicon member is provided, with an attachment element receiving portion adapted to at least partially enclose the attachment member. The attachment element is then fixedly secured within the attachment element receiving portion.

In an embodiment, the step of fixedly securing the attachment element can be accomplished by providing a first transverse bore in the attachment element and a second transverse bore in the attachment element receiving portion. The first and second transverse bores are coaxial with one another, and adapted to receive a locating pin. Once the first and second bores are coaxially aligned with one another, the locating pin is secured in the first and second transverse bores. The pin can be provided with a length slightly greater than the combined length of the first and second bores, in which instance the pin can be secured in the following manner. First, the locating pin is inserted in the aligned bores such that a portion of the locating pin extends outwardly from an outer limit of the first and second bores. Next, the extending portion of the locating pin is machined off flush with the outer limit of the first and second bores.

Alternatively, the locating pin can be provided with an outer diameter substantially equal to an inner diameter of the first and second bores, in which instance the pin can be secured in the following manner. First, the locating pin is cryogenically frozen, causing the locating pin to contract. Next, the locating pin is inserted in the aligned bores while maintaining the bores at ambient or higher temperature. Then, the locating pin is caused to expand by allowing the locating pin to return to ambient temperature.

In an alternative securing step, energy can be applied to at least one of the attachment element and the attachment element receiving portion to fuse the attachment element to the attachment element receiving portion. In an embodiment, the attachment element receiving portion of the second silicon member is provided with an access bore. Laser energy is applied through the access bore to form a tack weld between the attachment element and the attachment element receiving portion. Alternatively, the attachment element and the attachment element retaining portion can be substantially coextensive. Laser energy can be applied to an area adjacent to both the attachment element and the attachment element receiving portion.

In yet another embodiment, the first silicon member is provided with a peripheral ridge at its terminal end. The second silicon member is provided with a peripheral trench at its terminal edge. Laser energy is applied to cause the peripheral ridge of the first silicon member to melt into the peripheral trench of the second silicon member. Laser energy is applied to heat the ridge to a temperature of approximately 1450° C. for approximately 3 minutes, or until the silicon melt has filled the peripheral trench.

In still another embodiment, the step of fixedly securing the attachment element within the attachment element receiving portion includes the step of applying a high-bond, non-contaminating adhesive between the attachment element and the attachment element receiving portion.

The attachment element can be generally cylindrical, with the attachment element receiving portion being formed as a cylindrical bore having a diameter and length corresponding to those of the attachment element. The first and second silicon members can be formed from monocrystalline silicon, polycrystalline silicon, or virgin polysilicon.

A silicon wafer processing fixture is also provided. The fixture includes a generally elongate silicon support member having an attachment element extending outwardly from a terminal end thereof. The fixture is also provided with a generally planar silicon base. The base includes an attachment element receiving portion having the attachment element of the support member fixedly secured therein.

DETAILED DESCRIPTION OF THE PREFERRED EMBODIMENTS

Figure 1:
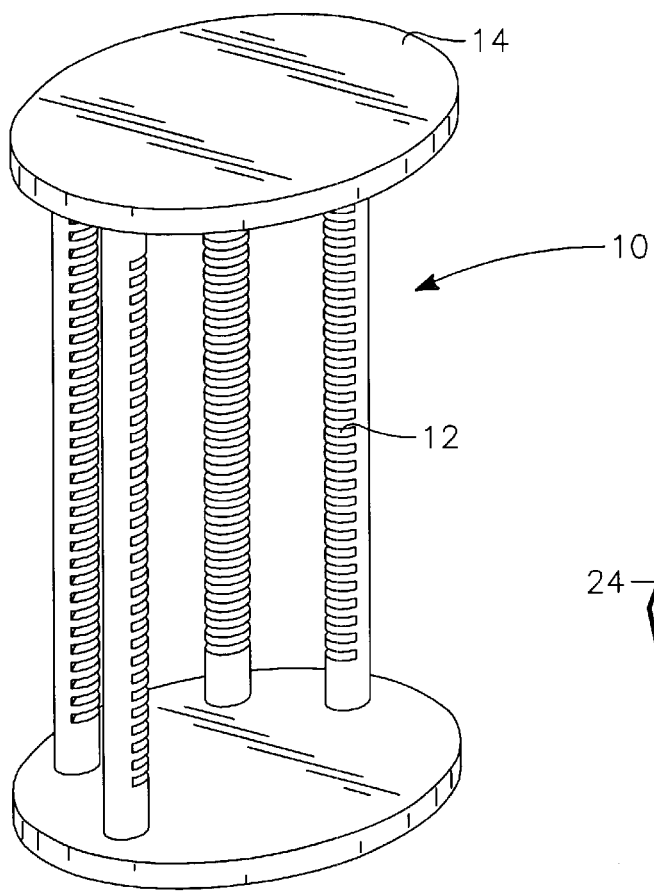
FIG. 1 is a perspective view of a silicon wafer processing fixture incorporating the principles of the present invention.

A silicon wafer processing fixture 10 is shown in FIG. 1. The silicon wafer processing fixture 10 includes a plurality of generally elongate support members 12 secured between a pair of generally planar base members 14. The support members 12 and the base members 14 can be fabricated from an inert crystalline material, such as monocrystalline or polycrystalline silicon, and can be fabricated in any suitable manner. The illustrated support members 12 can be produced advantageously in accordance with the methods and apparatus described in U.S. patent application, Ser. No. 09/292,495 and U.S. patent application, Ser. No. 09/292,496.

Figure 2:
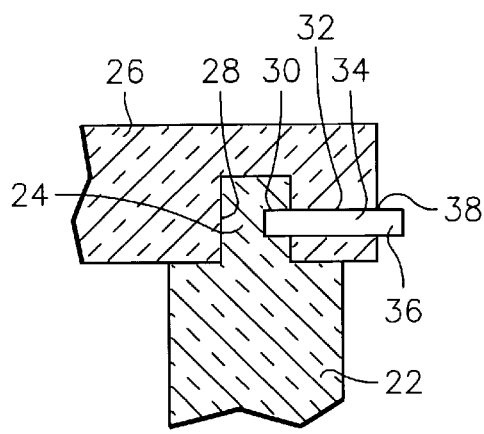
FIGS. 2 through 8 are sectional views showing techniques for securing the components of silicon wafer processing fixtures.

Various techniques for securing the support members to the base members are illustrated in FIGS. 2 through 8. In each of these examples, as shown in FIG. 2, a first silicon member 22, here shown as the support member, is provided with an outwardly-extending attachment element 24. A second silicon member 26, here the base member, is provided with an attachment element receiving portion 28. The receiving portion 28 is adapted to at least partially enclose the attachment element 24.

To fixedly secure the attachment element 24 within the attachment element receiving portion 28, a first transverse bore 30 is provided in the attachment element, and a second transverse bore 32 is provided in the attachment element receiving portion 28. The first transverse bore 30 and the second transverse bore 32 are adapted to receive a locating pin 34 when coaxially aligned with one another.

The locating pin 34 can be secured in the first and second transverse bores in several ways. In the FIG. 2 embodiment, the locating pin 34 is slightly longer than the combined lengths of the first and second bores. The locating pin 34 is inserted in the aligned bores 30, 32 such that a portion 36 of the locating pin extends outwardly from an outer limit 38 of the first and second bores. Next, the extending portion 36 of the locating pin 34 is machined off flush with the outer limit 38 of the first and second bores 30, 32.

Figure 3:
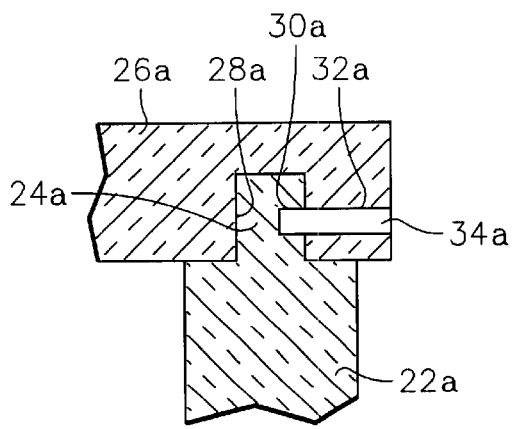

An alternative securing technique is illustrated in FIG. 3, wherein a locating pin 34a has an outer diameter $D_1$ substantially equal to the inner diameter $D_2$ of the first and second bores 30a, 32a. In this example, the locating pin 34a is cryogenically frozen to approximately −100° C., thus causing the locating pin to contract. Next, the locating pin 34a is inserted in the aligned bores 30a, 32a while maintaining the bores at ambient temperature. Then, the locating pin 34a is caused to expand by allowing it to return to ambient temperature. The diameter of the locating pin 34a contracts approximately 0.001% when cryogenically frozen.

As an alternative to the techniques incorporating locating pins, energy can be applied to the attachment element, the attachment element receiving portion, or both to fuse the attachment element to the attachment element receiving portion.

Figure 4:
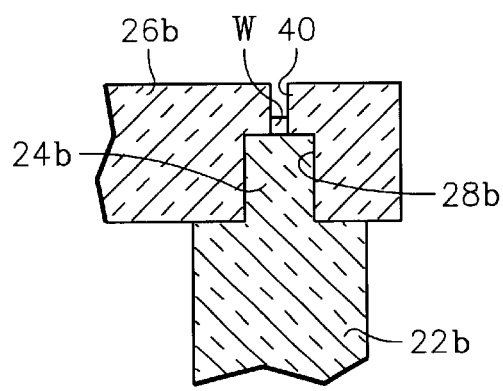

One example of such a technique is shown in FIG. 4. In this example, the attachment element receiving portion 28b of the second silicon member 26b includes an access bore 40. Laser energy is applied through the access bore 40 to form a tack weld W between the attachment element 24b and the attachment element receiving portion 28b. It has been found that advantageous results are achieved with laser energy from a 250 watt $CO_2$ laser having a pulse width of 30 ns and a pulse period of 0.001 sec, applied for 1–5 minutes. Any suitable source of laser energy may be employed, such as a $CO_2$ laser manufactured by Coherent.

Figure 5:
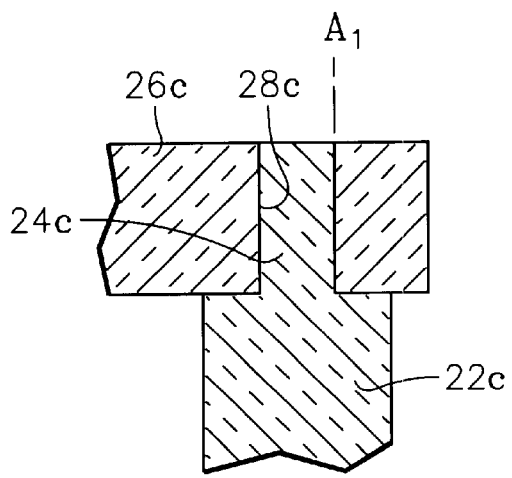

Another example is illustrated in FIG. 5. In this example, the attachment element 24c and the attachment element retaining portion 28c are substantially coextensive. Laser energy can be applied to an area A adjacent to both the attachment element and the attachment element receiving portion to form a tack weld, which can extend around all or part of the area A. Any suitable source of laser energy may be employed, such as the previously described $CO_2$ laser.

Figure 6:
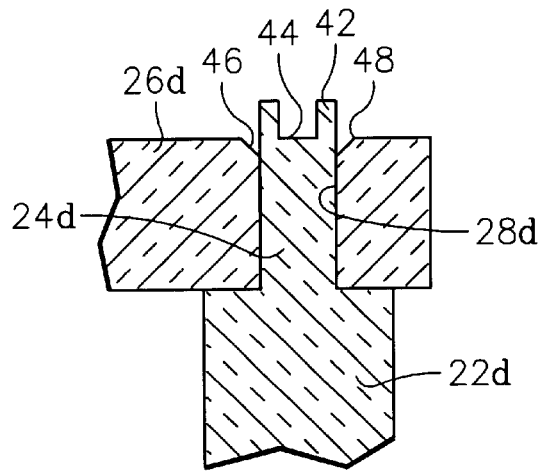
Figure 7:
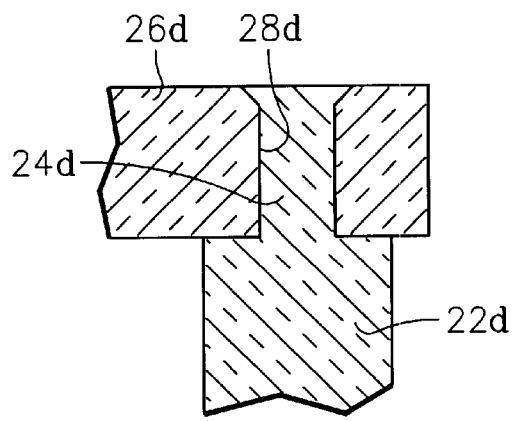

In the examples shown in FIGS. 6 and 7, an attachment member 24d includes a peripheral ridge 42 at its terminal end 44. The attachment element receiving portion 28d of the second silicon member 26d includes a peripheral trench 46 at its terminal edge 48. Heat energy is applied to cause the peripheral ridge 42 of the first silicon member 22d to melt into the peripheral trench 46 of the second silicon member 26d, thus fusing the attachment element 24d to the attachment element receiving portion 28d. Any suitable heat source can be used to apply heat. It has been found that one heat source that can be used advantageously is heat generated from laser energy. Laser energy is used to heat the ridge 42 to a temperature of approximately 1450° for approximately 3 minutes, or until the silicon melt has filled the peripheral trench 46.

Figure 8:
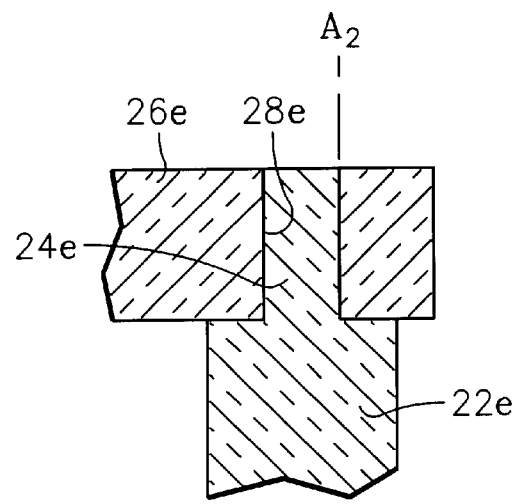

Another securing technique is shown in FIG. 8. In this example, the step of fixedly securing the attachment element 24e within the attachment element receiving portion 28e includes the step of applying adhesive at an area $A_2$ between the attachment element and the attachment element receiving portion. In order to avoid contamination usually associated with the use of adhesives, a high-temperature, non-contaminating adhesive should be used.

The attachment elements illustrated in FIGS. 1 through 8 are shown as being generally cylindrical, with the attachment element receiving portions being formed as a cylindrical bores. It is to be understood, however, that these configurations are for exemplary purposes only, and that any suitable cooperating shapes may be chosen for the attachment elements and associated retaining portions.

The present invention enables the fabrication of monocrystalline silicon, polycrystalline silicon, or virgin polysilicon structural members for use in the manufacture of semiconductor wafers and the like, and is applicable to any large scale and/or complex fixture or part used in the processing of silicon wafers. Components using structural members in accordance with the present invention eliminate deformation during high-temperature process applications. Since the source material is the same quality as the wafers material, particulate contamination and "crystal slip" inherent with known materials such as silicon carbide is virtually eliminated. Furthermore, there is no shadowing, since the source material provides a one-to-one duplication of the physical properties and critical constants of process wafers. Monosilicon fixtures and parts provide tolerances and expected service life unachievable with those made from commonly-used materials such as quartz or silicon carbide. The present invention enables the fabrication of silicon parts and fixtures that provide advantages as the industry moves to 300 mm and larger wafer diameters.

Although the present invention has been described with reference to specific embodiments, those of skill in the art will recognize that changes may be made thereto without departing from the scope and spirit of the invention.

What is claimed is:

1. A silicon wafer processing fixture, comprising:
   two silicon bases; and
   a plurality of axially extending silicon structural members consisting essentially of virgin polysilicon, the opposed ends of each of which are fixedly secured to respective ones of said bases and being configured to support a plurality of wafers.

2. A silicon wafer processing fixture comprising:
   a plurality of generally elongate silicon structural support members consisting essentially of virgin polysilicon each including an attachment elements extending outwardly from terminal ends thereof; and,
   two silicon bases each including a plurality of attachment element receiving portions each having a respective one of the attachment elements of the structural support members fixedly secured therein.

3. The fixture of claim 2, wherein said silicon bases are generally planar.

4. The fixture of claim 2, wherein said support fixture is configured as a vertically extending tower for supporting a plurality of silicon wafers.

5. A method of fabricating a silicon wafer processing fixture, comprising the steps of:
   forming a plurality of axially extending virgin polysilicon structural members configured to support a plurality of wafers; and
   then securing opposed ends of each of said virgin polysilicon structural members to respective ones of two silicon bases.

6. The method of claim 5, wherein said support fixture is configured as a vertically extending support tower to support said plurality of wafers.

7. The method of claim 5, wherein said securing step comprises welding.

8. The method of claim 5, wherein said welding comprises laser welding.

9. The method of claim 5, wherein said securing step comprises applying adhesive in areas between said silicon members and said bases.

10. The method of claim 5, wherein said virgin polysilicon structural members consist essentially of virgin polysilicon.

11. A method of fabricating a silicon wafer processing fixture, comprising the steps of:
   forming a plurality of axially extending silicon members comprising virgin polysilicon and configured to support a plurality of wafers; and
   securing opposed ends of each of said silicon members to respective ones of two silicon bases.

12. The method of claim 11, wherein said fixture is configured as a vertically extending support tower.

13. The method of claim 11, wherein said silicon members consist essentially of virgin polysilicon.

14. The method of claim 11, wherein said securing step comprises welding said opposed ends to respective ones of said two silicon bases.

15. The method of claim 14, wherein said welding comprises laser welding.

* * * * *